United States Patent

Kimura

[15] 3,636,417

[45] Jan. 18, 1972

[54] SCHOTTKY BARRIER SEMICONDUCTOR DEVICE

[72] Inventor: Akihiro Kimura, Takatsuki-City, Japan

[73] Assignee: Matsushita Electronics Corporation, Osaka-Prefecture, Japan

[22] Filed: Apr. 2, 1969

[21] Appl. No.: 812,753

[30] Foreign Application Priority Data

Apr. 5, 1968 Japan....................................43/23015

[52] U.S. Cl...........................................317/234, 317/235 U

[51] Int. Cl...........................................................H01l 9/00

[58] Field of Search..................................................317/235

[56] References Cited

UNITED STATES PATENTS

| | | | |
|---|---|---|---|
| 2,987,658 | 6/1961 | Messenger | 317/234 |
| 3,322,581 | 5/1967 | Hendrickson et al. | 317/235 |
| 3,454,843 | 7/1969 | Fulop et al. | 317/235 |

FOREIGN PATENTS OR APPLICATIONS

| | | | |
|---|---|---|---|
| 1,139,495 | 1/1969 | Great Britain | 317/234 |

OTHER PUBLICATIONS

IBM Tech. Discl. Bul., " Schottky Barrier Diode" by Stiles et al., Vol. 11, No. 1, June 1968

*Primary Examiner*—Jerry D. Craig
*Attorney*—Craig, Antonelli and Hill

[57] ABSTRACT

A semiconductor device having a Schottky barrier is prepared by forming a hollow or recess in a major surface of a semiconductor substrate, such as silicon, germanium or gallium arsenide, and then forming a layer of metal, such as nickel, tungsten, molybdenum, vanadium, gold or palladium, in the recess. The metal contacting the semiconductor material forms a Schottky barrier in the recess. It is preferred that the recess exceed 200A. in thickness and that the thickness of the metal layer exceed the depth of the recess.

In another embodiment, a layer of insulation is provided on the major surface of the semiconductor surface. Then, a hole is opened through the insulating layer and a recess is formed in the substrate. Thereafter, a metal layer is formed in the recess as described above.

5 Claims, 4 Drawing Figures

Inventor
AKIHIRO KIMURA

By Craig, Antonelli, Stewart & Hill
Attorneys

FIG. 3 (Present Invention)
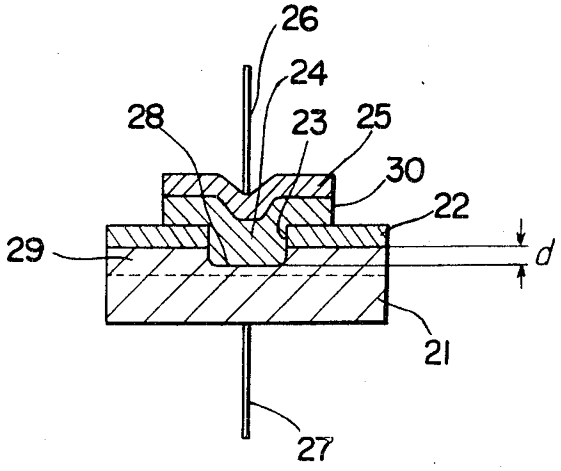
FIG. 4
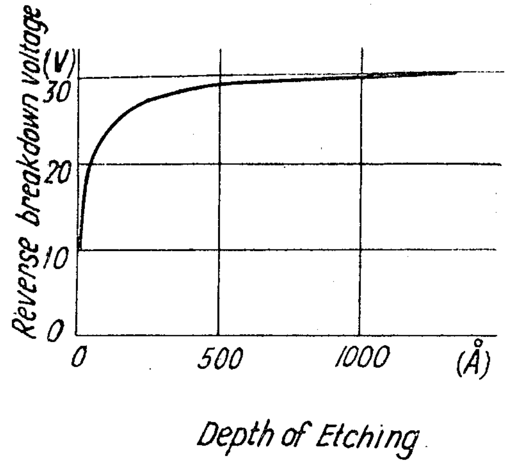
Inventor
AKIHIRO KIMURA
By Craig, Antonelli, Stewart & Hill
Attorneys

SCHOTTKY BARRIER SEMICONDUCTOR DEVICE

BACKGROUND OF THE INVENTION

This invention relates to an improved semiconductor device having a Schottky barrier and a method of making the same.

Semiconductor devices having Schottky barriers are well known. Among such conventional devices are, for instance, planar-type and mesa-type diodes made by forming a layer of a metal, such as nickel, molybdenum, tungsten, vanadium, gold or palladium, on a substrate of a semiconductor material, such as silicon, germanium or gallium arsenide.

In this connection, FIG. 1 and 2 illustrate a sectional side view of a conventional planar-type diode having a Schottky barrier and a conventional mesa-type diode having a Schottky barrier, respectively.

Referring to FIG. 1, there is shown a conventional planar-type Schottky barrier diode comprising an insulating film 2 of an oxide of silicon provided on the surface of the silicon substrate 1. A layer of nickel 4 is provided on the substrate 1 and on a portion of the insulating film 2 to form a Schottky barrier 8 between the surface of the silicon substrate 1 and the layer of nickel 4. A metal electrode layer 5, such as nickel or gold, and a pair of lead wires 6 and 7 are shown bonded to the surface of the electrode layer 5 and the bottom of substrate 1, respectively.

Although the planar device illustrated in FIG. 1 has a Schottky barrier, it does not possess an acceptably high reverse breakdown voltage due to the general nature of such planar-type semiconductor devices.

In an attempt to obviate the problems inherent in planar-type Schottky barrier devices, mesa-type devices have been employed. In conventional mesa-type Schottky barrier diodes, such as that illustrated in FIG. 2, a layer of nickel 14 is provided on the top of a silicon substrate 11 by means of vacuum deposition, sputtering or chemical deposition, in order to form a Schottky barrier 18 between the surface of the silicon substrate 11 and the layer of nickel 14. Subsequently, an electrode layer 15 of metal such as nickel, aluminum or gold is provided on the layer of nickel 14 by means of vacuum deposition, and the substrate 11, together with the layer of nickel 14 and electrode layer 15, is mesa etched. Finally, a pair of lead wires 6 and 7 are bonded on the surface of electrode layer 15 and the bottom of substrate 11, respectively.

Although the above-mentioned mesa-type diode can obtain a high reverse breakdown voltage, its stability is relatively inadequate due to the exposure of the edge of the Schottky barrier 18 to the surrounding atmosphere or surrounding materials. Consequently, such mesa-type devices require a special sealing structure.

SUMMARY OF THE INVENTION

Accordingly, it is an object of the present invention to provide an improved semiconductor device having a Schottky barrier as well as a high reverse breakdown voltage, and a method of making the same.

It is another object to provide an improved semiconductor device having a Schottky barrier and a sufficiently high reverse breakdown voltage as well as a simple construction, and a method of making the same.

It is a further object to provide an improved semiconductor device having a Schottky barrier and having a relatively high stability, and a method of making the same.

In accordance with the present invention, these and other objects are effected by providing a metal layer, such as nickel, tungsten, molybdenum, vanadium, gold, or palladium and the like, in a recess or hollow formed in a major surface of a semiconductor substrate so that a Schottky barrier is formed between the metal layer and semiconductor substrate in the recess. The semiconductor substrate may comprise any suitable material, such as silicon, germanium, gallium arsenide or the like.

The invention also contemplates providing a layer of insulating material on the semiconductor substrate and thereafter forming a hole through the insulating material, through which the hollow or recess in the semiconductor substrate may be formed and through which a metal layer may be deposited in the recess.

BRIEF DESCRIPTION OF THE DRAWINGS

The invention will be more fully understood by reference to the following detailed description of specific embodiments thereof taken in conjunction with the drawing wherein:

FIG. 3 is a sectional side view of a diode according to the present invention; and FIG. 4 is a graph indicating the characteristics of semiconductor devices according to the present invention.

DETAILED DESCRIPTION

Figure 1:
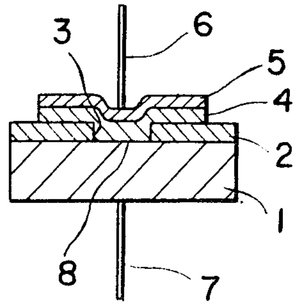
FIG. 1 (Prior Art)
FIGS. 1 and 2 are sectional side views of conventional planar-type and mesa-type devices, respectively, illustrating the differences between the present invention and the prior art.
Figure 2:
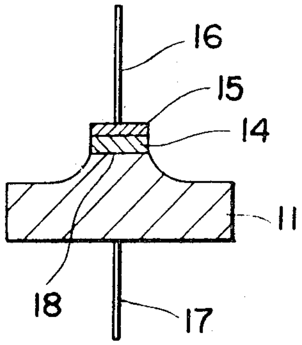
FIG. 2 (Prior Art)

A semiconductor device according to the present invention comprises at least one metal layer contacting the said semiconductor material to form one Schottky barrier between the semiconductor material and the metal layer, and is characterized in that the Schottky barrier is provided in a hollow or recess formed in a major surface of the substrate. In this connection, the semiconductor material may comprise silicon, germanium or gallium arsenide or the like, and the metal layer may comprise molybdenum, tungsten, vanadium, gold, palladium or the like.

Referring to FIG. 3, there is shown an illustrative embodiment of the present invention wherein an epitaxially grown layer 29 of silicon having thickness of 2 microns and resistivity of 0.7 Ωcm. is formed on one side of a silicon substrate 21 having resistivity of 0.005 Ωcm. An insulating film 22 of silicon dioxide having a thickness of 6,000 A. is formed on the layer 29. In other embodiments, a germanium substrate or a gallium arsenide substrate having an epitaxially grown layer on the surface thereof may be coated with an insulating film such as silicon dioxide or silicon nitride.

A hole, preferably a round hole 23 having a diameter of about 40 microns, is opened on the insulating film 22 by means of a known photoetching method, thus exposing the epitaxially grown silicon layer 29 through the hole 23. Subsequently, the surface of the silicon layer 29 is immersed in a known etching bath, for example, a bath prepared by mixing nitric acid, fluoric acid and acetic acid in the volume ratio of 6:1:2, to engrave the exposed silicon layer 29 so as to form a hollow or recess 28 having depth of about 4,000 A. in the layer 29. After rinsing and drying, a metal layer 24 of nickel, for example, having a thickness of about 5,000 A. is formed on the surface of the hollow 28 and on the surface of the surrounding insulating film 22 by depositing nickel in a vacuum of $4\times10^{-6}$ torr. Subsequently, a photoetching process is carried out to remove a portion of the metal layer from the insulating film 22 so that an electrode, preferably a round electrode 30 having a diameter of about 60 microns, covers the hole 23. A solder layer 25 may then be provided on the round electrode 30, however, the provision of a solder layer 25 is not essential. Finally, a pair of lead wires 26 and 27 are respectively bonded on the solder layer 25 and on the bottom face of the substrate 21.

In accordance with the present invention, a particularly suitable reverse breakdown voltage may be attained by providing a depth "*d*" of the hollow 28 of around 4,000 A. and a thickness of between about 5,000 A. and 10,000 A. of the insulating film 22. One example of the relation between the depth "*d*" of the hollow 28 and the reverse breakdown voltage is shown in FIG. 4, wherein the graphically depicted curve bends around an etching depth "*d*" of 100 A., and indicates a sufficiently high value and a relatively stable rate of increase of the reverse breakdown voltage above about 200 A. In other words, for a hollow 28 having a depth "*d*" over 200 A., a reverse breakdown voltage as high as three times that of a conventional device can be obtained.

It has also been experimentally found that in order to readily obtain a uniformly stable device, the thickness of the metal layer 24 which contacts the surface of silicon layer 29 is preferably larger than the depth "*d*" of the hollow 28. Namely, a thickness exceeding 4,000 A. is preferable for metal layer 24.

Though FIG. 4 illustrates only one example of a device in accordance with the present invention, other examples (not shown) indicate similar characteristics and exhibit distinctively improved reverse breakdown voltages.

Experiments also indicate that improved reverse breakdown voltages may be achieved in semiconductor devices having no insulating film thereon so long as a Schottky barrier is provided in a hollow engraved on a surface of a semiconductor substrate.

In general, the characteristic of a diode having a Schottky barrier is indicated by the following equation $$J=Js[\exp(qVa/nkT)-1]$$

wherein:

$J$ is the current density (ampere/cm.$^2$);

$Va$ is the voltage applied across the barrier (volt);

$q$ is the electronic charge (coulomb);

$k$ is the Boltzman's constant;

$T$ is the absolute temperature;

$n$ is an empirical constant; and $Js$ is the reverse saturation current density (ampere/cm.$^2$).

The value $q/nkT$ can be calculated from the tangent of the curve indicating the relation between $J$ and $Va$. Empirically, when $T$ is constant, the empirical constant $n$ has a value of $$n \geq 1.$$

The value $n$ indicates the degree of perfectness of the Schottky barrier, the theoretical value being 1 and the actual value being 1.03 to 1.06 for barriers of good quality. In the above-described embodiment, the empirical value of $n$ was improved by around 0.01 to 0.02 in comparison with conventional Schottky barrier diodes of the planar type. The reason for such an improvement is not completely understood, however it is believed that the barrier formed at the junction face between the metal layer and the surface of semiconductor exposed through the hollow nears perfection when it is formed in accordance with the present invention.

It is to be understood that the above-described embodiments are merely illustrative of the principles of the invention. Thus, although the invention has been described in connection with the formation of diodes, it is to be understood that the invention is not so limited and that various kinds of semiconductor devices such as transistors or integrated circuits having Schottky barriers may be devised by those skilled in the art which will embody the principles of the invention and fall within the spirit and scope thereof.

The semiconductor devices of the present invention have an improved reverse breakdown voltage and an improved stability in spite of a relatively simple construction, and they are particularly useful in applications requiring the use of extremely high frequencies.

What is claimed is:

1. A semiconductor device having a Schottky barrier and comprising a substrate of semiconductor material, an insulating film covering said semiconductor material and a metal layer contacting said semiconductor material to form a Schottky barrier between said material and said layer, characterized in that said Schottky barrier comprises said metal layer which substantially fills a recess formed in said substrate through a hole opened in said insulating film and extends outside said recess thereby continuously covering the whole area of said recess, surrounding the edge part between the insulating film and the substrate, and further covering a part of said insulating film surrounding said hole.

2. The semiconductor device of claim 1, wherein the depth of said recess is greater than 200 A.

3. The semiconductor device of claim 1, wherein the depth of said recess is about 4,000 A., wherein the thickness of said layer of insulating film is from about 5,000 A. to 10,000 A. and, wherein the thickness of said metal layer exceeds the depth of said recess.

4. A semiconductor device having a Schottky barrier, which comprises:

a semiconductor substrate having a hollow formed in a major surface thereof, said hollow having a depth of at least 200 A. and a linear expanse of about 40 $\mu$;

a layer of insulating material disposed on said major surface of said substrate, said insulating material having a thickness of from about 5,000 A. to 10,000 A. and having a hole therethrough to expose said hollow in said substrate; and a metal layer disposed on said insulating layer and in said hollow to form a Schottky barrier in said hollow, said metal layer having a thickness exceeding the depth of said hollow and having a linear expanse of about 60 $\mu$.

5. The semiconductor device of claim 4, wherein said hollow and said hole have a substantially circular cross section of about 40 $\mu$ in diameter, respectively.

* * * * *